United States Patent
Punzenberger et al.

[19]

[11] Patent Number: 5,945,874
[45] Date of Patent: Aug. 31, 1999

[54] CIRCUIT CONFIGURATION FOR SMOOTHING A VOLTAGE

[75] Inventors: Manfred Punzenberger, Gallneukirchen; Bernhard Zojer, Villach, both of Austria

[73] Assignee: Siemens Aktiengesellschaft, Munich, Germany

[21] Appl. No.: 08/684,937

[22] Filed: Jul. 19, 1996

[30] Foreign Application Priority Data

Jul. 19, 1995 [GB] United Kingdom ............. 195 26 390

[51] Int. Cl.$^6$ .................................. H03K 5/00; H03B 1/04
[52] U.S. Cl. .......................... 327/558; 327/552; 327/344; 327/336; 327/103; 327/538; 327/311; 330/109
[58] Field of Search ...................... 327/552, 558, 327/524, 311, 103, 344, 336, 538, 293; 330/293, 294, 107, 109, 303

[56] References Cited

U.S. PATENT DOCUMENTS

| | | | |
|---|---|---|---|
| 5,001,441 | 3/1991 | Gen-Kuong | 330/107 |
| 5,266,852 | 11/1993 | Shigenari et al. | 327/552 |
| 5,327,027 | 7/1994 | Taylor | 327/526 |

FOREIGN PATENT DOCUMENTS

| | | |
|---|---|---|
| 29 03 299 | 12/1988 | Germany . |
| 2-198214 | 6/1990 | Japan . |
| 403214805 | 9/1991 | Japan ........................... 327/558 |
| 405121959 | 5/1993 | Japan ........................... 327/293 |

OTHER PUBLICATIONS

"Edge steepness of an active filter with FDNR's", Electronics Worksheet No. 164, 1984, pp. 69–72.

Abstract of Novel Continuous, Time Mosfet, C Circuit Structures Using Component Simulation (Suming), Republic of China, pp. 480–483.

"Semi–Conductor Switching Technique" (Tietze et al.), 9th edition, Springer Publishers, 1990, pp. 412–416.

*Primary Examiner*—Dinh Le
*Attorney, Agent, or Firm*—Herbert L. Lerner; Laurence A. Greenberg

[57] ABSTRACT

A circuit configuration for smoothing an input voltage includes two input terminals for receiving the input voltage. A negative-feedback amplifier has two inputs and an output. A capacitor is connected to one of the inputs of the amplifier. An output terminal is connected to the output of the amplifier. A converter element has a first terminal connected to one of the input terminals, a second terminal connected to the one input of the amplifier and to the capacitor, and a third terminal connected to the output of the amplifier.

1 Claim, 2 Drawing Sheets

CIRCUIT CONFIGURATION FOR SMOOTHING A VOLTAGE

BACKGROUND OF THE INVENTION

Field of the Invention

The invention relates to a circuit configuration for smoothing an input voltage applied to two input terminals, with the aid of a low-pass filter and a negative-feedback amplifier having one input connected to a capacitor and an output connected to an output terminal.

One such circuit configuration for smoothing an input voltage is known, for instance, from the book by U. Tietze and C. Schenk, entitled: Halbleiter-Schaltungstechnik [Semiconductor Circuit Technology], Springer-Verlag, 7th Edition, 1988, p. 400. In that circuit, an RC element including a resistor and a capacitor is provided as the low-pass filter and is followed by a negative-feedback amplifier as an impedance converter. An output of the impedance converter is applied to an output terminal and, through an ohmic voltage divider, to the reference potential. The voltage tap of the voltage divider is coupled to the inverting input of the operational amplifier. The known circuit makes largely load-independent properties of the low-pass filter possible as well as a free choice of the direct voltage gain.

Particularly in an integrated circuit configuration, the known smoothing circuit has the disadvantage of only permitting very small time constants to be achieved.

Both the resistor and the capacitor require a large area on a chip, and that results in high chip costs. An external RC low-pass filter, on the other hand, requires elements with high electric strength and entails additional expense for connection pins.

SUMMARY OF THE INVENTION

It is accordingly an object of the invention to provide a circuit configuration for smoothing an input voltage that needs a capacitor with low electric strength, which overcomes the hereinafore-mentioned disadvantages of the heretofore-known devices of this general type and which is maximally integratable.

With the foregoing and other objects in view there is provided, in accordance with the invention, a circuit configuration for smoothing an input voltage with the aid of a low-pass filter, comprising two input terminals for receiving an input voltage; a negative-feedback amplifier having two inputs and an output; a capacitor connected to one of the inputs of the amplifier; an output terminal connected to the output of the amplifier; and a converter element having a first terminal connected to one of the input terminals, a second terminal connected to the one input of the amplifier and to the capacitor, and a third terminal connected to the output of the amplifier.

In accordance with another feature of the invention, there is provided a resistor, the converter element being a current mirror, and the third terminal of the current mirror being connected through the resistor to the output of the amplifier.

In accordance with a further feature of the invention, the converter element is a transconductance circuit, the second terminal of the transconductance circuit is an output connected to the one input of the amplifier, and the third terminal having of the transconductance circuit being an input connected to the output of the amplifier.

In accordance with an added feature of the invention, there is provided a voltage divider being connected to the output of the amplifier and to a reference potential and having a voltage tap, and one of the inputs of the amplifier being an inverting input connected to the tap.

In accordance with a concomitant feature of the invention, the inputs of the amplifier are inverting and non-inverting inputs, and there is provided a first resistor connected to a reference potential and to the inverting input of the amplifier, and a second resistor connected to a further potential, the converter element being a current mirror connected to the output of the amplifier and having one branch connected to the first resistor and another branch connected to the second resistor.

Other features which are considered as characteristic for the invention are set forth in the appended claims.

Although the invention is illustrated and described herein as embodied in a circuit configuration for smoothing a voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
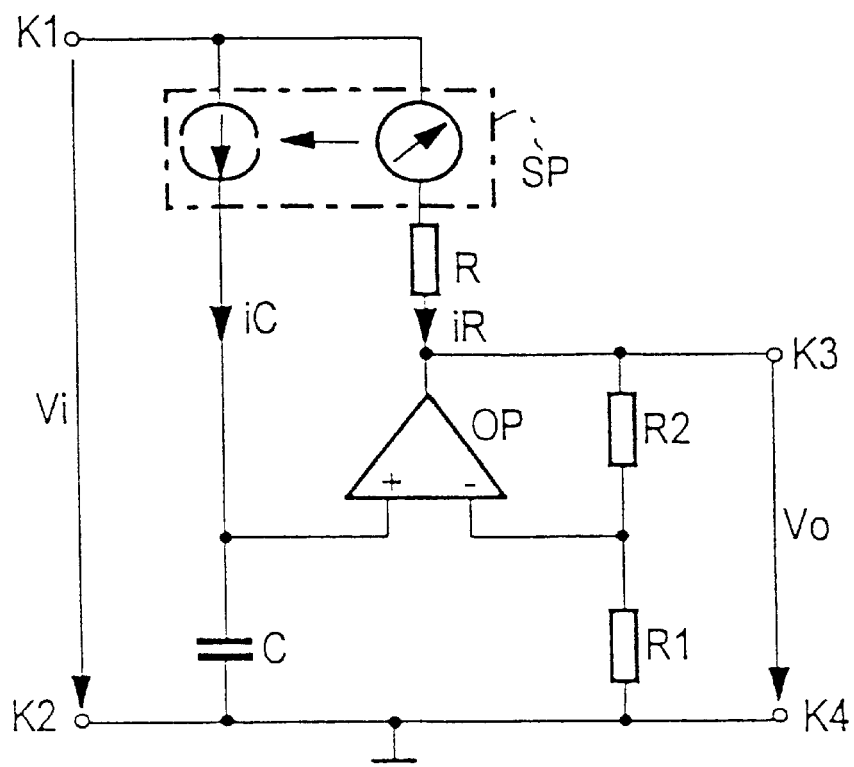
FIG. 1 is a schematic circuit diagram of a first exemplary embodiment of the invention with a current mirror as a converter element.

Referring now to the figures of the drawings in detail and first, particularly, to FIG. 1 thereof, it is seen that an input voltage Vi is applied to two input terminals K1 and K2. The terminal K1 is connected to two terminals of a current mirror SP, which can be constructed in a way familiar to one skilled in the art as a converter element. Current mirrors are known, for instance, from the aforementioned book by Tietze and Schenk, p. 62. The current mirror has a first terminal connected to the input terminal K1 and two branches. One branch has a second terminal connected to a non-inverting input terminal of an operational amplifier OP and to a first terminal of a capacitor C. The other branch has a third terminal connected through a resistor R to an output of the operational amplifier OP. The output of the operational amplifier OP is connected to a first output terminal K3 and to an ohmic voltage divider having resistor elements R2 and R1 with first and second terminals. A voltage tap of the ohmic voltage divider is located between the first terminals of the resistors R1 and R2 and is connected to an inverting input of the operational amplifier. A second terminal of the capacitor C and the second terminal of the resistor R1, along with the terminal K2 and a second output terminal K4, are all located at reference potential. A smoothed output voltage Vo is located between the terminals K3 and K4.

The principle of the circuit of FIG. 1 is equivalent to that of a first order RC low-pass filter. The resistor R generates a current iR, which is proportional to a voltage difference between the input voltage Vi and the output voltage Vo. The current iR is integrated at the capacitor C. The capacitor C may be constructed as an external component, while the remainder of the circuit configuration is integratable. The element OP together with the elements R1 and R2 form an internal voltage amplifier and impedance converter. This amplifier circuit, which is negatively fed back with the aid of the ohmic voltage divider, has a direct voltage gain k=1+R2/R1. Since the voltage at the capacitor C is tapped at the non-inverting input of the operational amplifier OP, the output voltage Vo of the circuit configuration thus proves to be the voltage at the capacitor C, amplified by the factor k. Expressed in other terms, the effective capacitance at the output is lower by the factor k than a capacitance c. A charge current iC for the capacitor C is generated with the aid of the current iR flowing through the resistor R and with the aid of the current mirror SP.

Figure 2:
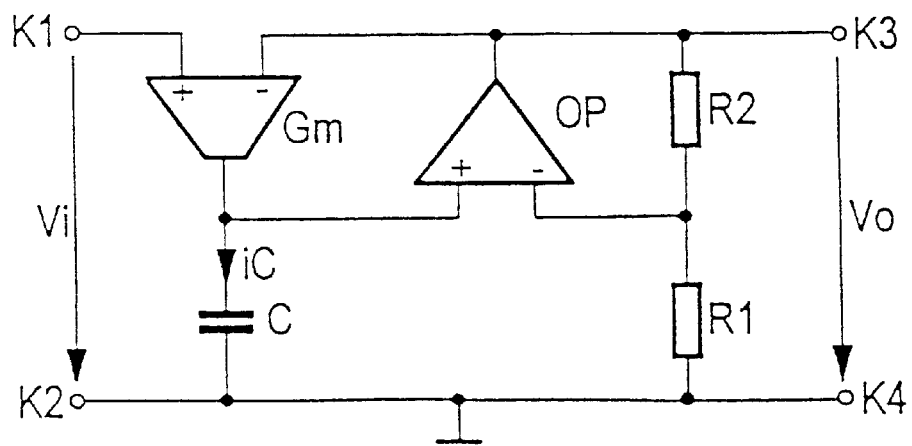
FIG. 2 is a circuit diagram of a second exemplary embodiment with a transconductance as the converter element.

FIG. 2 differs from FIG. 1 in that the resistor R and the current mirror SP are replaced with a transconductance Gm as a converter element. A non-inverting input representing the first terminal of the transconductance Gm is connected to the terminal K1 and an inverting input of the transconductance Gm representing the third terminal is connected to the output of the operational amplifier OP. An output of the transconductance Gm representing the second terminal is connected to the non-inverting input of the operational amplifier OP on one hand and to the capacitor C on the other hand. The layout of the transconductance Gm, especially in the form of an active circuit element, is familiar to one skilled in the art and is known, for instance, from the aforementioned book by Tietze and Schenk. The transconductance allows a comparatively large differential input voltage at its inputs and high flexibility with respect to time constants of the circuit configuration, a static voltage drop, and a transient response of the configuration.

Figure 3:
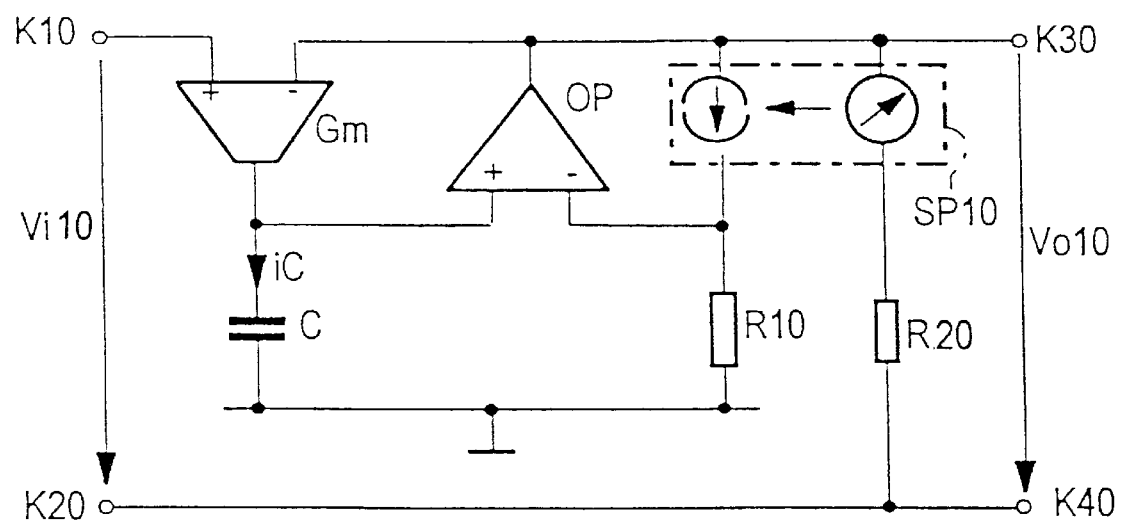
FIG. 3 is a circuit diagram of a third exemplary embodiment with a reference-voltage-free output voltage.

FIG. 3 differs from the circuit of FIG. 2 in that only the capacitor C and a resistor R10 are connected to reference potential. The resistor R2 of FIG. 2 is replaced with a resistor R20 and a current mirror SP10, one branch of which is connected to the inverting input of the operational amplifier OP and supplies the resistor R10, and the other branch of which supplies the resistor R20. A terminal of the resistor R20 that is not connected to the current mirror SP10 and terminals K20 and K40, which are reference terminals for an input voltage $V_{i10}$ and an output voltage $V_{o10}$, are connected to one another. In this variant circuit as well, the resistors R10 and R20 perform the function of a voltage divider. The configuration of FIG. 3 makes it possible to switch the capacitance C to reference potential, even though the input voltage and the output voltage of the circuit configuration have no ground reference, or in other words are reference-voltage-free.

We claim:

1. A circuit for smoothing an input voltage with a low-pass filter, comprising:

a first and a second input terminal for receiving an input voltage;

a negative-feedback amplifier having an inverting input, a non-inverting input and an amplifier output;

a capacitor having a first capacitor terminal connected to a reference potential and a second capacitor terminal connected to said non-inverting input of said amplifier;

a first and a second output terminal for outputting an output voltage, said first output terminal connected to said amplifier output;

a transconductance circuit having a first transconductance terminal connected to said first input terminal, a second transconductance terminal connected to said non-inverting input of said amplifier and to said capacitor, and a third transconductance terminal connected to said amplifier output, said transconductance circuit outputting a current proportional to a voltage difference between the input voltage and the output voltage;

a first resistor connected between the reference potential and said inverting input of said amplifier;

a second resistor having a first and a second terminal, said first terminal of said second resistor connected to said second output terminal and to said second input terminal, said second output terminal and said second input terminal not connected to said reference potential; and a current mirror having a terminal connected to said amplifier output, said current mirror having one branch connected to said first resistor and said inverting input of said amplifier and another branch connected to said second terminal of said second resistor.

* * * * *